United States Patent
Lu et al.

(10) Patent No.: US 12,057,532 B2
(45) Date of Patent: Aug. 6, 2024

(54) LIGHT-EMITTING DEVICE, LIGHT-EMITTING SUBSTRATE AND METHOD FOR MANUFACTURING THE SAME, AND LIGHT-EMITTING APPARATUS

(71) Applicant: BOE TECHNOLOGY GROUP CO., LTD., Beijing (CN)

(72) Inventors: Tianhao Lu, Beijing (CN); Wei Huang, Beijing (CN); Dejiang Zhao, Beijing (CN); Yu Tian, Beijing (CN); Xiaoyun Liu, Beijing (CN); Qian Sun, Beijing (CN); Qian Jin, Beijing (CN); Yang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 461 days.

(21) Appl. No.: 17/610,400

(22) PCT Filed: Nov. 19, 2020

(86) PCT No.: PCT/CN2020/130099
§ 371 (c)(1),
(2) Date: Nov. 10, 2021

(87) PCT Pub. No.: WO2022/104646
PCT Pub. Date: May 27, 2022

(65) Prior Publication Data
US 2022/0352434 A1 Nov. 3, 2022

(51) Int. Cl.
*H01L 33/50* (2010.01)
*F21V 9/30* (2018.01)
(Continued)

(52) U.S. Cl.
CPC .............. *H01L 33/505* (2013.01); *F21V 9/30* (2018.02); *H01L 33/005* (2013.01); *H01L 33/46* (2013.01);
(Continued)

(58) Field of Classification Search
CPC ..... H01L 33/505; H01L 33/58; H01L 33/005; H01L 33/46; H01L 2933/0025; H01L 2933/0041; F21V 9/30
See application file for complete search history.

(56) References Cited

U.S. PATENT DOCUMENTS

2010/0051996 A1* 3/2010 Hsu .................. H01L 33/507
257/98
2012/0299043 A1 11/2012 Hsu
(Continued)

FOREIGN PATENT DOCUMENTS

CN 102227012 A 10/2011
CN 102347432 A 2/2012
(Continued)

Primary Examiner — Mary Ellen Bowman
(74) Attorney, Agent, or Firm — IP & T GROUP LLP

(57) ABSTRACT

A light-emitting device includes: a light-emitting element; a light conversion layer disposed on a light exit side of the light-emitting element and including a first portion and a second portion located on a side of the first portion in a first direction; a first material layer disposed between the light-emitting element and the light conversion layer and configured such that light emitted by the light-emitting element is incident into the light conversion layer; and a second material layer on a side of the first material layer in the first direction, a third material layer on a side face of the light conversion layer, and a fourth material layer on a side of the light conversion layer away from the light-emitting element, which are configured such that light unconverted by the light (Continued)

conversion layer is reflected on surfaces of a structure formed by the second, third and fourth material layers.

19 Claims, 8 Drawing Sheets

(51) Int. Cl.
    *H01L 33/00*         (2010.01)
    *H01L 33/46*         (2010.01)
    *H01L 33/58*         (2010.01)

(52) U.S. Cl.
    CPC ...... *H01L 33/58* (2013.01); *H01L 2933/0025* (2013.01); *H01L 2933/0041* (2013.01)

(56) References Cited

U.S. PATENT DOCUMENTS

| | | | |
|---|---|---|---|
| 2017/0250327 A1* | 8/2017 | Hsieh | H01L 33/60 |
| 2019/0348585 A1* | 11/2019 | Woodgate | H01L 33/504 |
| 2020/0411489 A1* | 12/2020 | Ahmed | H01L 33/42 |
| 2022/0131027 A1* | 4/2022 | Akimoto | H01L 33/50 |
| 2023/0047170 A1* | 2/2023 | Hsieh | H01L 33/005 |

FOREIGN PATENT DOCUMENTS

| | | |
|---|---|---|
| CN | 104505451 A | 4/2015 |
| TW | 201010136 A | 3/2010 |

\* cited by examiner ated herein# LIGHT-EMITTING DEVICE, LIGHT-EMITTING SUBSTRATE AND METHOD FOR MANUFACTURING THE SAME, AND LIGHT-EMITTING APPARATUS

CROSS-REFERENCE TO RELATED APPLICATION

This application is a national phase entry under 35 USC 371 of International Patent Application No. PCT/CN2020/130099, filed on Nov. 19, 2020, which is incorporated herein by reference in its entirety.

TECHNICAL FIELD

The present disclosure relates to the field of illumination and display technologies, and in particular, to a light-emitting device, a light-emitting substrate and a method for manufacturing the same, and a light-emitting apparatus.

BACKGROUND

A quantum dot photoluminescent material has characteristics of wide color gamut, pure light color and the like, and thus a display effect of high brightness and wide color gamut may be achieved by combining the quantum dot photoluminescent material with micro light-emitting diodes (Micro LEDs) emitting blue light that has characteristics of high brightness and low power consumption.

SUMMARY

In an aspect, a light-emitting device is provided. The light-emitting device includes: a light-emitting element including a light exit surface; a light conversion layer disposed on a light exit side of the light-emitting element, the light conversion layer including a first portion and a second portion located on a side of the first portion in a first direction, the first direction being perpendicular to a thickness direction of the light-emitting element, an orthogonal projection of the first portion on a plane perpendicular to the thickness direction of the light-emitting element overlapping with an orthogonal projection of the light exit surface on the plane; a first material layer disposed between the light-emitting element and the light conversion layer, an orthogonal projection of the first material layer on the plane overlapping with the orthogonal projection of the light exit surface on the plane; a second material layer located on a side of the first material layer in the first direction, an orthogonal projection of the second material layer on the plane overlapping with an orthogonal projection of the second portion on the plane; a third material layer located on a side face of the light conversion layer, an orthogonal projection of the third material layer on the plane overlapping with the orthogonal projection of the light exit surface on the plane; and a fourth material layer located on a side of the light conversion layer away from the light-emitting element. The first material layer is configured such that a portion of light emitted by the light-emitting element corresponding to a region where the first material layer is located is incident into the light conversion layer through the first material layer, so that the light conversion layer converts a wavelength of the light emitted by the light-emitting element. The second material layer, the third material layer and the fourth material layer are configured such that light unconverted by the light conversion layer is reflected on surfaces of a structure formed by the second material layer, the third material layer and the fourth material layer, and light converted by the light conversion layer exits through the fourth material layer.

In some embodiments, the first portion of the light conversion layer includes a first surface and a second surface that are sequentially arranged in a light exit direction of the light-emitting element; the second portion of the light conversion layer includes a third surface and a fourth surface that are sequentially arranged in the light exit direction of the light-emitting element; the first surface is in contact with the first material layer, and the second surface is in contact with the third material layer; the third surface is in contact with the second material layer, and the fourth surface is in contact with the fourth material layer; a surface of the third material layer in contact with the second surface is an inclined surface, and an included angle between the inclined surface and the first surface is α; the inclined surface intersects with a plane where the first surface is located at a straight line, and a section of the light conversion layer is in a shape of a right trapezoid in a sectional direction perpendicular to the straight line; and a ratio of each of a refractive index of the first material layer and a refractive index of the fourth material layer to a refractive index of the light conversion layer is less than sin α; a ratio of a refractive index of the second material layer to the refractive index of the light conversion layer is less than sin α, and/or, at least a surface of the second material layer in contact with the third surface is a reflective surface; a ratio of a refractive index of the third material layer to the refractive index of the light conversion layer is less than sin α, and/or, at least a surface of the third material layer in contact with the second surface is a reflective surface.

In some embodiments, the light conversion layer further includes a fifth surface opposite to the second surface; and the light-emitting device further includes a fifth material layer disposed on the fifth surface; and a ratio of a refractive index of the fifth material layer to the refractive index of the light conversion layer is less than sin α, and/or, at least a surface of the fifth material layer in contact with the fifth surface is a reflective surface.

In some embodiments, α is less than or equal to 60°.

In some embodiments, α is equal to 60°, the surface of the third material layer in contact with the second surface is the reflective surface, a length of a top side of the right trapezoid is 3n times a length of the light exit surface of the light-emitting element in the first direction, and a height of the right trapezoid is $\sqrt{3}$ times the length of the light exit surface of the light-emitting element in the first direction, n being an integer greater than or equal to 1.

In some embodiments, α is not equal to 60°, the surface of the third material layer in contact with the second surface is the reflective surface, and the light-emitting device further includes a filter film disposed on a side of the fourth material layer away from the light conversion layer and configured to filter the light emitted by the light-emitting element.

In some embodiments, at least the surface of the third material layer in contact with the second surface is the reflective surface, and the third material layer includes a support layer and a metal reflective layer disposed on a surface of the support layer facing the light conversion layer. A surface of the metal reflective layer facing the light conversion layer is a reflective surface.

In some embodiments, a material of the light conversion layer includes a quantum dot luminescent material, and the material of the light conversion layer does not include scattering particles.

In some embodiments, the light-emitting element is a light-emitting diode.

The light-emitting device further includes a light extraction structure disposed between the light-emitting element and the first material layer, and configured to cause the light emitted by the light-emitting element to be incident into the first material layer vertically.

In some embodiments, the light-emitting device further includes a lens structure disposed on a light exit surface of the fourth material layer. The lens structure is configured to diffuse light exiting from the fourth material layer.

In another aspect, a light-emitting substrate is provided. The light-emitting substrate includes a base and a plurality of light-emitting devices disposed on the base. At least one light-emitting device is the light-emitting device described above.

In some embodiments, the at least one light-emitting device includes at least two light-emitting devices, and the light conversion layer of each light-emitting device in the at least two light-emitting devices includes a fifth surface opposite to a second surface that is in contact with the third material layer. The at least two light-emitting devices include first light-emitting device(s) and second light-emitting device(s) that are sequentially arranged in the first direction and adjacent. The third material layer of a second light-emitting device is in contact with the fifth surface of the light conversion layer of a first light-emitting device.

In some embodiments, each of the at least one light-emitting device further includes a fifth material layer disposed on the fifth surface opposite to the second surface; a material of the fifth material layer is the same as a material of the third material layer, or, the third material layer of the light-emitting device includes a support layer, a first reflective layer disposed on a surface of the support layer away from the light conversion layer of the light-emitting device, and a second reflective layer disposed on a surface of the support layer facing the light conversion layer of the light-emitting device. The first reflective layer serves as the fifth material layer of an adjacent light-emitting device.

In yet another aspect, a light-emitting apparatus is provided. The light-emitting apparatus includes the light-emitting substrate described above.

In yet another aspect, a method for manufacturing a light-emitting substrate is provided. The method includes: forming a plurality of light-emitting devices on a base. Forming each of at least one light-emitting device includes: forming a light-emitting element on the base, the light-emitting element including a light exit surface; forming a first material layer and a second material layer on the base on which the light-emitting element has been formed, an orthogonal projection of the first material layer on the base overlapping with an orthogonal projection of the light exit surface on the base, the second material layer being located on a side of the first material layer in a first direction, the first direction being parallel to a plane perpendicular to a thickness direction of the light-emitting element; forming a third material layer on the base on which the first material layer and the second material layer have been formed, an orthogonal projection of the third material layer on the base overlapping with the orthogonal projection of the light exit surface on the base; forming a light conversion layer on the base on which the first material layer, the second material layer and the third material layer have been formed, the light conversion layer including a first portion and a second portion, an orthogonal projection of the first portion on the base overlapping with the orthogonal projection of the light exit surface on the plane, an orthogonal projection of the second portion on the base overlapping with an orthogonal projection of the second material layer on the base; and forming a fourth material layer on a side of the light conversion layer away from the base. The first material layer is configured such that a portion of light emitted by the light-emitting element corresponding to the first material layer is incident into the light conversion layer through the first material layer, so that the light conversion layer converts a wavelength of the light emitted by the light-emitting element, and the second material layer, the third material layer and the fourth material layer are configured such that light unconverted by the light conversion layer is reflected on surfaces of a structure formed by the second material layer, the third material layer and the fourth material layer, and light converted by the light conversion layer exits through the fourth material layer.

In some embodiments, the at least one light-emitting device includes first light-emitting device(s) and second light-emitting device(s) that are sequentially arranged in the first direction and adjacent, forming a first light-emitting device and a second light-emitting device on the base includes: forming light-emitting elements on the base, the light-emitting elements being spaced apart in the first direction, and the light exit surface of each light-emitting element being away from the base; forming first material layers on the base on which the light-emitting elements have been formed, a first material layer being located on the light exit surface of each light-emitting element; forming second material layers on the base on which the light-emitting elements have been formed, a second material layer being located on the side of the first material layer in the first direction; forming respective third material layers of the first light-emitting device and the second light-emitting device on the base on which the first material layers and the second material layers have been formed, a third material layer of each light-emitting device including a sixth surface and a seventh surface, an included angle between the seventh surface and a surface of the first material layer away from the base being $\alpha$, an included angle between the sixth surface and a plane where the surface of the first material layer away from the base is located being 90°; forming respective light conversion layers of the first light-emitting device and the second light-emitting device on the base on which the third material layers have been formed, a light conversion layer of each light-emitting device being formed in a depression formed by the first material layer, the second material layer and the third material layer of the light-emitting device and the third material layer of an adjacent light-emitting device; and forming respective fourth material layers of the first light emitting device and the second light emitting device on the base on which the light conversion layers have been formed.

In some embodiments, a ratio of a refractive index of the second material layer to a refractive index of the light conversion layer is less than $\sin \alpha$, and the second material layer and the first material layer are formed through a same patterning process.

In some embodiments, at least a surface of the second material layer in contact with the light conversion layer is a reflective surface, and forming the second material layer includes: forming a metal film on the base on which the light-emitting elements have been formed; and forming a metal reflective layer through a patterning process to form the second material layer.

In some embodiments, the at least one light-emitting device further includes a fifth material layer, and forming the first light-emitting device and the second light-emitting device further includes: forming the fifth material layer of each light-emitting device at a same time when the third material layer of each light-emitting device is formed. or forming the third material layer of the light-emitting device includes: forming a support layer with a first sputtering surface and a second sputtering surface through a patterning process, the first sputtering surface being perpendicular to the plane where the surface of the first material layer away from the base is located, an included angle between the second sputtering surface and the surface of the first material layer away from the base being α; and forming a metal reflective layer on the second sputtering surface through a sputtering process, and forming another metal reflective layer on the first sputtering surface through a sputtering process at a same time, so as to form the fifth material layer of the adjacent light-emitting device for contacting the light conversion layer of the adjacent light-emitting device.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
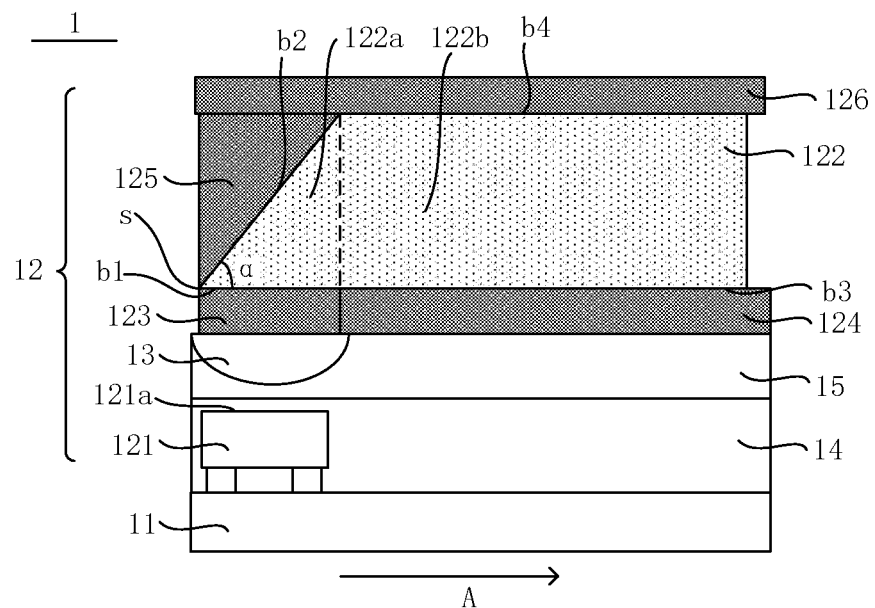
FIG. 1 is a sectional view of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meanings, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, a feature defined with "first" and "second" may explicitly or implicitly include one or more of the features. In the description of the embodiments of the present disclosure, the term "a plurality of/the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The terms such as "about" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed to be limited to the shapes of the regions shown herein, but to include deviations in the shapes due to, for example, manufacturing.

For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes a light-emitting substrate. Of course, the light-emitting apparatus may further include other component(s), such as a component for providing electrical signals to the light-emitting substrate to drive the light-emitting substrate to emit light, which may be referred to as a control component. The component may include a circuit board electrically connected to the light-emitting substrate and/or an integrate circuit (IC) connected to the light-emitting substrate.

In some embodiments, the light-emitting apparatus may be an illumination apparatus. In this case, the light-emitting apparatus is used as a light source to realize an illumination function. For example, the light-emitting apparatus may be a backlight module in a liquid crystal display apparatus, a lamp for internal or external illumination, or a signal lamp.

In some other embodiments, the light-emitting apparatus may be a display apparatus for displaying images (i.e., pictures). In this case, the light-emitting apparatus may include a display or a product including a display. The display may be a flat panel display (FPD), a micro display, etc. If classified according to whether a user can see a scenario of a back of the display, the display may be a transparent display or an opaque display. If classified according to whether the display can be bent or rolled, the display may be a flexible display or a common display (which may be referred to as a rigid display). For example, the product including the display may be a computer display, a television, a billboard, a laser printer with a display function, a telephone, a mobile phone, a personal digital assistant (PDA), a laptop computer, a digital camera, a camcorder, a viewfinder, a vehicle, a large-area wall, a screen in a theater, a sign in a stadium, etc.

Figure 2:
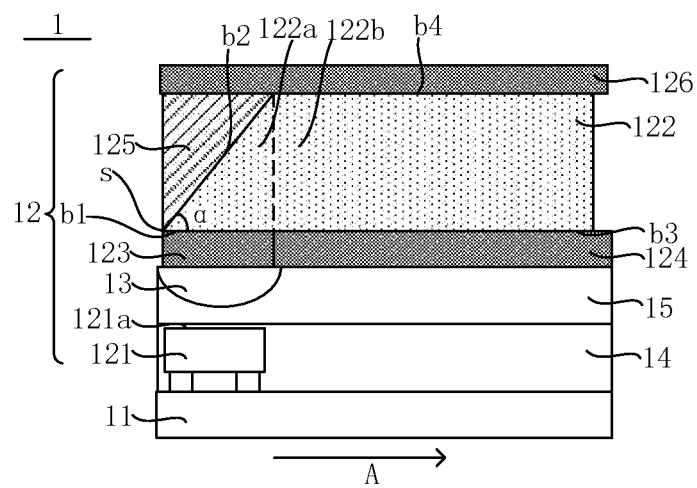
FIG. 2 is a sectional view of a light-emitting substrate, in accordance with some other embodiments.
Figure 3:
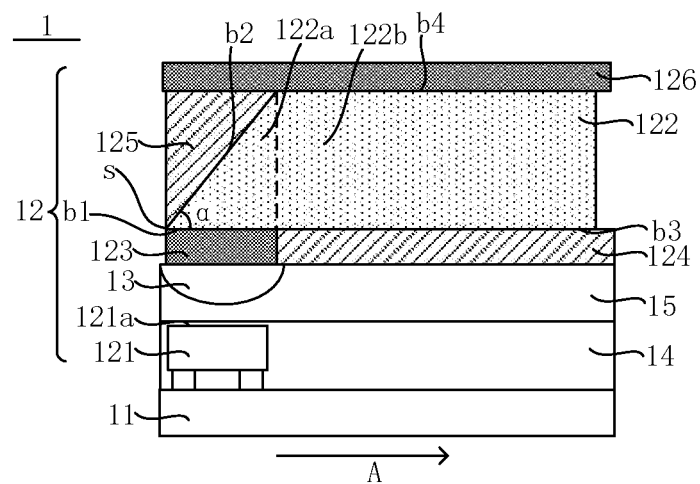
FIG. 3 is a sectional view of a light-emitting substrate, in accordance with yet some other embodiments.

Some embodiments of the present disclosure provide a light-emitting substrate applied to the light-emitting apparatus. As shown in FIGS. 1 to 3, the light-emitting substrate 1 includes a base 11 and a plurality of light-emitting devices 12 disposed on the base 11.

At least one light-emitting device 12 includes a light-emitting element 121 and a light conversion layer 122. The light-emitting element 121 includes a light exit surface 121a. The light conversion layer 122 is disposed on a light exit side of the light-emitting element 121. The light conversion layer 122 includes a first portion 122a and a second portion 122b located on a side, in a first direction A, of the first portion 122a, and an orthogonal projection of the first portion 122a on the base 11 (or a plane perpendicular to a thickness direction of the light-emitting element 121) overlaps with an orthogonal projection of the light exit surface 121a on the base 11 (or the plane perpendicular to the thickness direction of the light-emitting element 121). The first direction A is perpendicular to a thickness direction of the base 1 (or the thickness direction of the light-emitting element 121).

The light-emitting element 121 may be an electroluminescent element, such as an organic light-emitting diode (OLED) or a light-emitting diode (LED). A material of the light conversion layer 122 may include a quantum dot luminescent material. The quantum dot luminescent material emits light when irradiated by light emitted by the light-emitting element 121, so as to convert a wavelength of the light emitted by the light-emitting element 121. For example, the light emitted by the light-emitting element 121 may be blue light, and the quantum dot luminescent material may emit red light or green light when excited by the blue light, thereby achieving the conversion of the wavelength.

In the case where the light-emitting element 121 is the electroluminescent element, the base 11 may be a base on which pixel driving circuits are provided, and the light-emitting element 121 is driven by a pixel driving circuit to emit light.

In some embodiments, as shown in FIGS. 1 to 3, the light-emitting element 121 is the light-emitting diode. In this case, the light-emitting element 121 may be formed on the base 11 by means of transfer printing. Since there is a large step difference between the light exit surface 121a of the light-emitting element 121 and the base 11 after the light-emitting element 121 is transferred onto the base 11, a planarization layer 14 may be formed on the base 11 on which the light-emitting element 121 has been formed by using an organic material to reduce the step difference.

In some embodiments, as shown in FIGS. 1, 2 and 3, in addition to the light-emitting element 121 and the light conversion layer 122, the at least one light-emitting device 12 further includes a first material layer 123 and a second material layer 124; the first material layer 123 is located between the light-emitting element 121 and the light conversion layer 122, and an orthogonal projection of the first material layer 123 on the base 11 overlaps with the orthogonal projection of the light exit surface 121a on the base 11; and the second material layer 124 is located on a side, in the first direction A, of the first material layer 123, and an orthogonal projection of the second material layer 124 on the base 11 overlaps with an orthogonal projection of the second portion 122b of the light conversion layer 122 on the base 11. The at least one light-emitting device 12 further includes a third material layer 125 and a fourth material layer 126; the third material layer 125 is located on a side face of the light conversion layer 122, and an orthogonal projection of the third material layer 125 on the base 11 overlaps with the orthogonal projection of the light exit surface 121a on the base 11; and the fourth material layer 126 is located on a side of the light conversion layer 122 away from the light-emitting element 121. The first material layer 123 is configured such that a portion of the light emitted by the light-emitting element 121 corresponding to a region where the first material layer 123 is located is incident into the light conversion layer 122 through the first material layer 123, so that the light conversion layer 122 converts the wavelength of the light emitted by the light-emitting element 121. The second material layer 124, the third material layer 125 and the fourth material layer 126 are configured such that light unconverted by the light conversion layer 122 is reflected on surfaces of a structure formed by the second material layer 124, the third material layer 125 and the fourth material layer 126, and light converted by the light conversion layer 122 exits through the fourth material layer 126.

A specific material of the first material layer 123 is not limited here, as long as the portion of the light emitted by the light-emitting element 121 corresponding to the first material layer 123 can be incident into the light conversion layer 122 through the first material layer 123. For example, the material of the first material layer 123 may be a transparent material, or may be the same as the material of the light conversion layer 122.

The structure formed by the second material layer 124, the third material layer 125 and the fourth material layer 126 is not specifically limited here, as long as the light unconverted by the light conversion layer 122 can be reflected on the surfaces of the structure formed by the second material layer 124, the third material layer 125 and the fourth material layer 126.

In some embodiments, as shown in FIGS. 1 to 3, the first portion 122a of the light conversion layer 122 includes a first surface b1 and a second surface b2 that are sequentially arranged in a light exit direction of the light-emitting element 121. The second portion 122b of the light conversion layer 122 includes a third surface b3 and a fourth surface b4 that are sequentially arranged in the light exit direction of the light-emitting element 121. The first surface b1 is in contact with the first material layer 123, the second surface b2 is in contact with the third material layer 125, the third surface b3 is in contact with the second material layer 124, and the fourth surface b4 is in contact with the fourth material layer 126. A surface of the third material layer 125 in contact with the second surface b2 is an inclined surface, and an included angle between the inclined surface and the first surface b1 is α. The inclined surface intersects with a plane where the first surface b1 is located at a straight line s, and a section of the light conversion layer 122 is in a shape of a right trapezoid in a sectional direction perpendicular to the straight line s.

Based on the above structure, in some embodiments, as shown in FIGS. 1 to 3, a ratio of each of a refractive index of the first material layer 123 and a refractive index of the fourth material layer 126 to a refractive index of the light conversion layer 122 is less than sin α; a ratio of a refractive index of the second material layer 124 to the refractive index of the light conversion layer 122 is less than sin α, and/or, at least a surface of the second material layer 124 in contact with the third surface b3 is a reflective surface; a ratio of a refraction index of the third material layer 125 to the refractive index of the light conversion layer 122 is less than sin α, and/or, at least a surface of the third material layer 125 in contact with the second surface b2 is a reflective surface.

Figure 4:
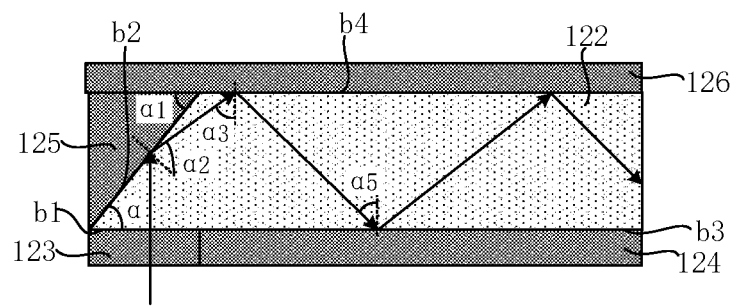
FIG. 4 is a diagram showing an optical path of light emitted by a light-emitting element, in accordance with some embodiments.

Since the first material layer 123 is in contact with the first surface b1, when the light-emitting element 121 emits light, as shown in FIG. 4, the portion of the light emitted by the light-emitting element 121 corresponding to the first material layer 123 can pass through the first material layer 123 and enter the light conversion layer 122. In this case, the portion of the light emitted by the light emitting element 121 corresponding to the first material layer 123 is not refracted when entering the light conversion layer 122 through the first material layer 123, and enters the light conversion layer 122 vertically. Since the surface of the third material layer 125 in contact with the second surface b2 is the inclined surface, and the included angle between the inclined surface and the first surface b1 is α, an incident angle, at an interface between the third material layer 125 and the light conversion layer 122, of the light entering the light conversion layer 122 vertically is equal to α. Since the ratio of the refractive index of the third material layer 125 to the refractive index of the light conversion layer 122 is less than sin α, and/or, the surface of the third material layer 125 in contact with at least the second surface b2 is the reflective surface, light incident onto the surface of the third material layer 125 in contact with the second surface b2 can be reflected, and a reflection angle α2 is equal to the incident angle α according to reflection principle. It can be known that, an incident angle α3 of the light at an interface between the fourth material layer 126 and the light conversion layer 122 is also equal to α. Since the ratio of the refractive index of the fourth material layer 126 to the refractive index of the light conversion layer 122 is less than sin α, and the ratio of the refractive index of the second material layer 124 to the refractive index of the light conversion layer 122 is less than sin α, and/or, at least the surface of the second material layer 124 in contact with the third surface b3 is the reflective surface, light incident onto the surface of the fourth material layer 126 in contact with the fourth surface b4 can propagate in the light conversion layer 122 in a form of total reflection. Therefore, a propagation path of the light emitted by the light-emitting element 121 in the light conversion layer 122 may be increased, and the light emitted by the light-emitting element 121 may be sufficiently received by the light conversion layer 122. As a result, the wavelength of the light emitted by the light-emitting element 121 may be sufficiently converted by the light conversion layer 122, and a light conversion efficiency may be improved. Compared with a case where there is a need to add scattering particles in the light conversion layer 122 to improve the light conversion efficiency, the embodiments of the present disclosure may not only improve the light conversion efficiency, and but also avoid a problem that process difficulty is increased due to addition of the scattering particles, and reduce leakage of the light unconverted by the light conversion layer 122.

Based on this, in some embodiments, the material of the light conversion layer 122 include the quantum dot luminescent material, but does not include the scattering particles.

In these embodiments, it may be possible to avoid the problem that the process difficulty is increased due to the addition of the scattering particles. In addition, it may be possible to avoid a problem that the addition of the scattering particles is not conductive to the propagation of the light emitted by the light-emitting element 121 in the light conversion layer 122.

Based on the above structures, in some embodiments, as shown in FIGS. 1 to 4, α is less than or equal to 60°.

Relative positional relationships between the first material layer 123, the second material layer 124, the third material layer 125 and the fourth material layer 126 will not be limited herein, as long as the first material layer 123 enables the portion of the light emitted by the light-emitting element 121 corresponding to the first material layer 123 to pass through the first material layer 123 and enter the light conversion layer 122, and the second material layer 124, the third material layer 125 and the fourth material layer 126 enable the light unconverted by the light conversion layer 122 to be reflected on the surfaces of the structure formed by the second material layer 124, the third material layer 125 and the fourth material layer 126.

The section of the light conversion layer 122 is in the shape of the right trapezoid, the first material layer 123 is in contact with the first surface b1 of the light conversion layer 122, the second material layer 124 is in contact with the third surface b3 of the light conversion layer 122, the third material layer 125 is in contact with the second surface b2 of the light conversion layer 122, and the fourth material layer 126 is in contact with the fourth surface b4 of the light conversion layer 122. Therefore, as shown in FIGS. 1 to 3, the orthogonal projection of the first material layer 123 on the base 11 does not overlap with the orthogonal projection of the second material layer 124 on the base 11, the orthogonal projection of the first material layer 123 on the base 11 overlaps with the orthogonal projection of the third material layer 125 on the base 11, and orthogonal projections of the first material layer 123 and the second material layer 124 on the base 11 are within an orthogonal projection of the fourth material layer 126 on the base 11.

The light passing through the first material layer 123 and entering the light conversion layer 122 may be incident onto the third material layer 125 in a vertical direction (i.e., a direction perpendicular to the first surface b1). An orthogonal projection of a combination of the first material layer 123 and the second material layer 124 on the base 11 may completely overlap with an orthogonal projection of a combination of the first surface b1 and the third surface b3 of the light conversion layer 122 on the base 11; and the orthogonal projection of the fourth material layer 126 on the base 11 may also completely overlap with the orthogonal projection of the combination of the first surface b1 and the third surface b1 of the light conversion layer 122 on the base 11. In this case, the light conversion layer 122 may be located in a cavity formed by the first material layer 123, the second material layer 124, the third material layer 125 and the fourth material layer 126; the first material layer 123, the light conversion layer 122, and the third material layer 125 forms a stacked structure of a material layer with a low refractive index, a material layer with a high refractive index and a material layer with a low refractive index (or a reflective layer) in sequence in a direction away from the base 11; and the second material layer 124, the light conversion layer 122, and the fourth material layer 126 forms a stacked structure of a material layer with a low refractive index (or a reflective layer), the material layer with the high refractive index and a material layer with a low refractive index in sequence in the direction away from the base 11. Thus, the unconverted light may be totally reflected on interfaces between the material layer with the high refractive index and adjacent material layers.

Here, it will be noted that, in practical applications, the light emitted by the light-emitting element 121 is not completely incident into the first material layer 123 in the vertical direction but there is a certain divergence angle. When the light entering the light conversion layer 122 through the first material layer 123 is incident onto the third material layer 125 in the vertical direction, the light reflected by the third material layer 125 may propagate in the light conversion layer 122. Based on this, in order to make the light emitted by the light-emitting element 121 incident into the first material layer 123 vertically, in some embodiments, as shown in FIGS. 1 to 3, in addition to the light-emitting element 121 and the light conversion layer 122, the at least one light-emitting device 12 may further include a light extraction structure 13 disposed between the light-emitting element 121 and the light conversion layer 122. The light extraction structure 13 is configured to cause the light emitted by the light-emitting element 121 to be incident into the first material layer 123 vertically. In this case, the orthogonal projection of the light exit surface 121a on the base 11 may be located within the orthogonal projection of the first material layer 123 on the base 11. The light extraction structure 13 may be a lens. In this case, the lens may be fixed through a transparent material layer 15.

Of course, in order to avoid light leakage caused by the light entering the light conversion layer 122 through the second material layer 124, in some embodiments, at least the surface of the second material layer 124 in contact with the third surface b3 is the reflective surface. That is, a material of the second material layer 124 is different from the material of the first material layer 123, and may be an opaque material.

Figure 5:
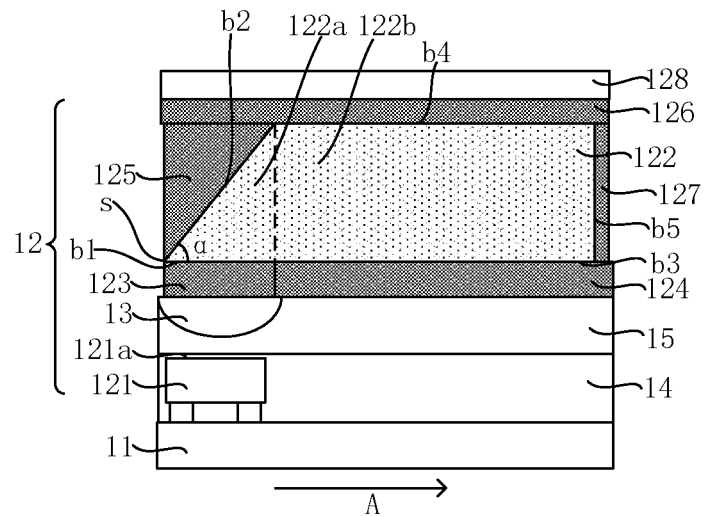
FIG. 5 is a sectional view of a light-emitting substrate, in accordance with yet some other embodiments.
Figure 6:
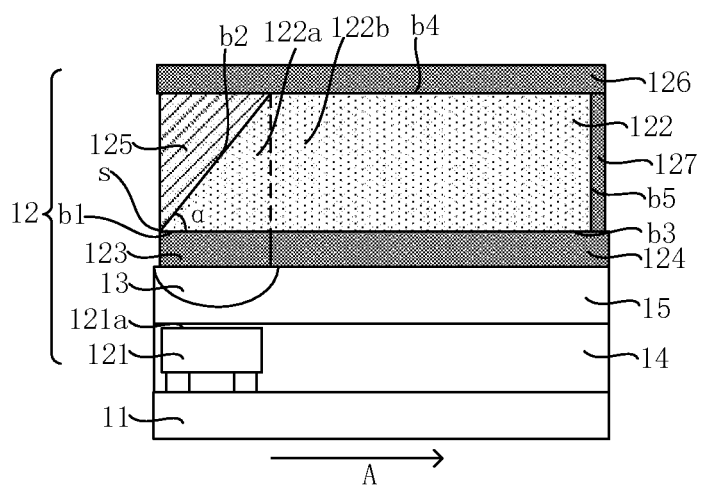
FIG. 6 is a sectional view of a light-emitting substrate, in accordance with yet some other embodiments.
Figure 7:
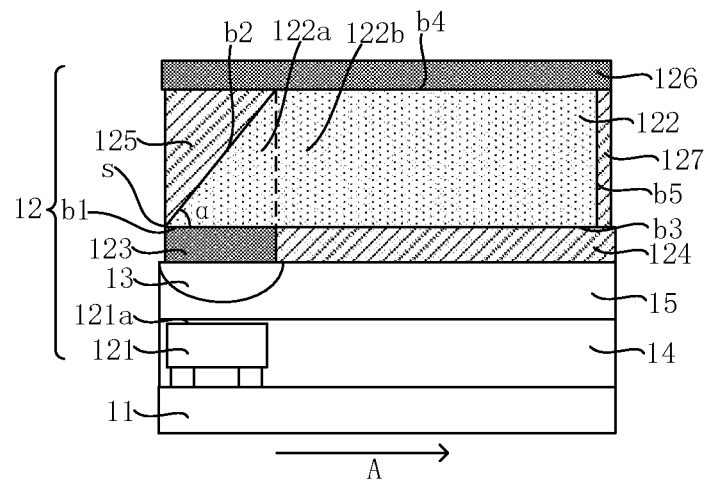
FIG. 7 is a sectional view of a light-emitting substrate, in accordance with yet some other embodiments.

In some embodiments, as shown in FIGS. 5 to 7, the light conversion layer 122 further includes a fifth surface b5 opposite to the second surface b2. The at least one light-emitting device 12 further includes a fifth material layer 127 disposed on the fifth surface b5. A ratio of a refractive index of the fifth material layer 127 to the refractive index of the light conversion layer 122 is less than sin $\alpha$; and/or, at least a surface of the fifth material layer 127 in contact with the fifth surface b5 is a reflective surface.

Figure 8:
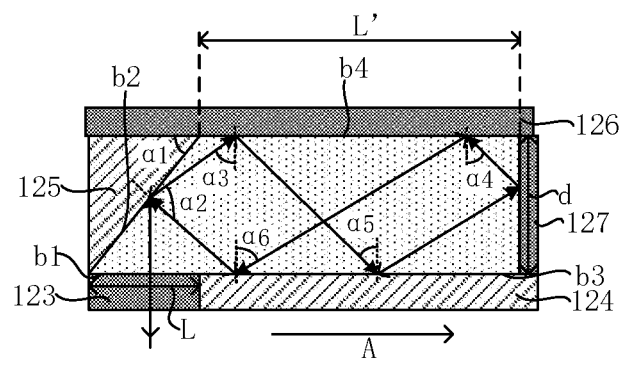
FIG. 8 is an optical path diagram of light emitted by a light-emitting element, in accordance with some other embodiments.

In these embodiments, by providing the fifth material layer 127, as shown in FIG. 8, light incident onto the fifth material layer 127 may continue to be reflected in the light conversion layer 122. Based on that the reflection angle is equal to the incident angle, it may be known that, the light reflected by the fifth material layer 127 may continue to propagate in the light conversion layer 122 in the form of total reflection, and finally return to the surface of the third material layer 125 in contact with the second surface b2. In this way, the propagation path of the light in the light conversion layer 122 may be further increased, and the light conversion efficiency may be further improved.

There are two different cases according to whether $\alpha$ is equal to 60°.

In a first case, as shown in FIG. 8, $\alpha$ is equal to 60°. In this case, the light reflected by the fifth material layer 127 is vertically incident on the surface of the third material layer 125 in contact with the second surface b2. In a case where the surface of the third material layer 125 in contact with the second surface b2 is the reflective surface, the light propagates in a reverse direction, and then exits from the first material layer 123 instead of exiting from the fourth material layer 126. Therefore, the light leakage may be avoided.

In a second case, $\alpha$ is not equal to 60°. In a case where the surface of the third material layer 125 in contact with the second surface b2 is the reflective surface, an incident angle may be smaller than a critical angle when the light reflected by the fifth material layer 127 subsequently propagates to the fourth material layer.

Based on this, in some embodiments, in the case where $\alpha$ is not equal to 60°, and the surface of the third material layer 125 in contact with the second surface b2 is the reflective surface, as shown in FIG. 5, the at least one light-emitting device 12 may further include a filter film 128 disposed on a side of the fourth material layer 126 away from the light conversion layer 122, and the filter film 128 is configured to filter the light emitted by the light-emitting element 121

By providing the filter film on the side of the fourth material layer 126 away from the light conversion layer 122 to filter the light unconverted by the light conversion layer 122, an impure light color may be avoided.

In an example in which the light emitted by the light-emitting element 121 is blue light, and the light conversion layer 122 may emit red light when excited by the blue light (that is, the light conversion layer 122 converts the blue light into red light with a long wavelength), by providing the filter film, unconverted blue light is filtered, so that color purity of the red light may be improved, and it may be possible to avoid the impure light color caused by the red light being mixed with the blue light.

For the first case, in order to make the light vertically incident on the surface of the third material layer 125 in contact with the second surface b2 continue to propagate in the light conversion layer 122 in the reverse direction, so as to further increase the propagation path of the light, in some embodiments, at least the surface of the third material layer 125 in contact with the second surface b2 is a reflective surface. Moreover, in this case, in order to avoid the light leakage caused by the light emitted by the light-emitting element 121 entering the light conversion layer 122 through the second material layer 124, at least the surface of the second material layer 124 in contact with the third surface b3 is also a reflective surface.

Based on the above structure, in order to ensure that the light is perpendicular to the surface of the third material layer 125 in contact with the second surface b2 when the light returns to the surface of the third material layer 125, there is a need to ensure that α2 is equal to α6, where α6 is an incident angle of light incident onto the second material layer 124 after being reflected by the fifth material layer 127 and the fourth material layer 126. Moreover, since an incident angle is equal to a reflection angle during total reflection or specular reflection, α3, α4, α5, α6 and α2 are all equal. Here, α4 is an incident angle of light incident onto the fourth material layer 126 after being reflected by the fifth material layer 127, and α5 is an incident angle of light incident onto the second material layer 124 after being reflected by the third material layer 125 and the fourth material layer 126. It may be known that, α1 is equal to α2, and a sum of α1, α2 and α3 is 180°, where α1 is an included angle between the second surface b2 and a surface of the third material layer 125 away from the base 11. Therefore, α1 is equal to 60°. According to an equation of the critical angle, i.e., n1×sin θi=n2×sin θt, it may be known that, in a case where θi is equal to 60°, a ratio of each of layers with low refractive indexes to the refractive index of the light conversion layer 122 is less than $\sqrt{3}/2$. Here, θi is an incident angle, θt is an reflection angle, n1 is a relatively high refractive index, and n2 is a relatively low refractive index, In a case where a length of the light exit surface 121a of the light-emitting element 121 in the first direction A is determined to be L, in some embodiments, as shown in FIG. 8, a length L' of a top side of the right trapezoid is 3n times the length L of the light exit surface 121a of the light-emitting element 121 in the first direction A, and a height d of the right trapezoid is $\sqrt{3}$ times the length of the light exit surface 121a of the light-emitting element 121 in the first direction A, n being an integer greater than or equal to 1.

For the second case, there is no need to maintain a specific length-to-width ratio of a cavity enclosed by the first material layer 123, the second material layer 124, the third material layer 125, the fourth material layer 126 and the fifth material layer 127. In this case, in order to increase the propagation path of the light in the light conversion layer 122, and to improve the light conversion efficiency, the length L' of the top side of the right trapezoid may be increased as much as possible at a corresponding resolution.

Based on the above structure, according to that the ratio of each of the refractive index of the first material layer 123 and the refractive index of the fourth material layer 126 to the refractive index of the light conversion layer 122 is less than sin α; the ratio of the refractive index of the third material layer 125 to the refractive index of the light conversion layer 122 is less than sin α, and/or at least the surface of the third material layer 125 in contact with the second surface b2 is the reflective surface; the ratio of the refractive index of the second material layer 124 to the refractive index of the light conversion layer 122 is less than sin α, and/or at least the surface of the second material layer 124 in contact with the third surface b3 is the reflective surface, in some embodiments, the first material layer 123 and the fourth material layer 126 may each be made of a material with a low refractive index, and the materials of the first material layer 123 and the fourth material layer 126 may be the same or different; the second material layer 124 and the third material layer 125 may each be made of a material with a low refractive index or a reflective material, and the materials of the second material layer 124 and the third material layer 125 may be the same or different.

Here, it will be noted that, the material with the low refractive index is described relative to the refractive index of the light conversion layer 122. The reflective material may be a metal reflective material, such as metallic silver or metallic aluminum.

Figure 9:
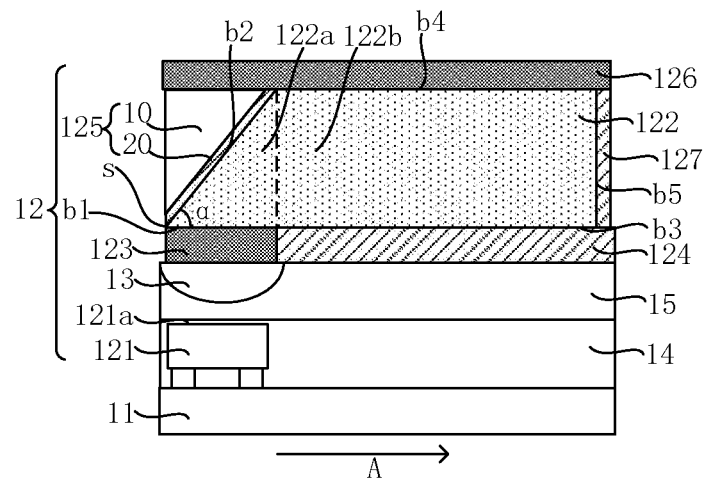
FIG. 9 is a sectional view of a light-emitting substrate, in accordance with yet some other embodiments.

In some embodiments, as shown in FIG. 9, in the case where at least the surface of the third material layer 125 in contact with the second surface b2 is the reflective surface, the third material layer 125 includes a support layer 10 and a metal reflective layer 20 disposed on a surface of the support layer 10 facing the light conversion layer 122. A surface of the metal reflective layer 20 facing the light conversion layer 122 is the reflective surface.

In these embodiments, in a process of forming the third material layer 125 with the reflective surface, by forming the support layer 10 and then forming the metal reflective layer 20 on the surface of the support layer 10 facing the light conversion layer 122 through sputtering, the third material layer 125 with the reflective surface is formed.

Figure 10:
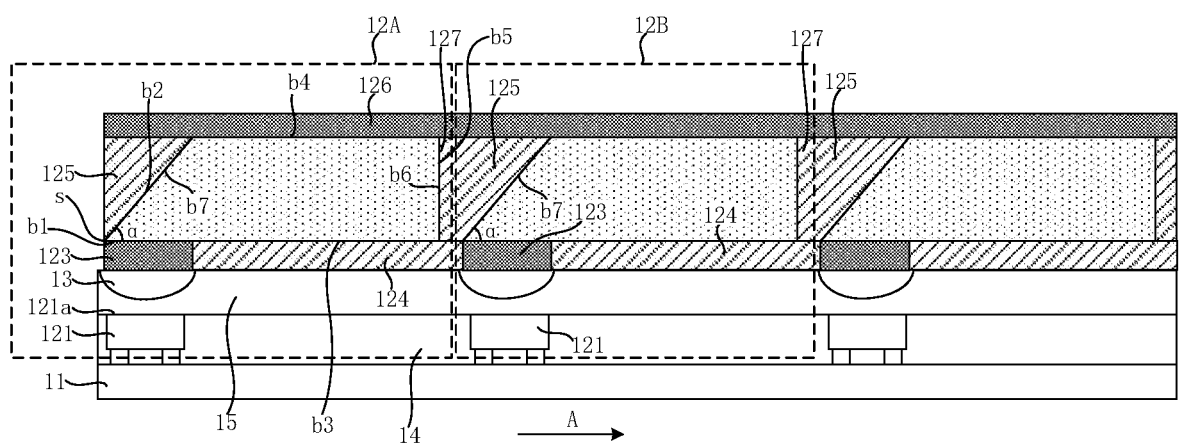
FIG. 10 is a sectional view of a light-emitting substrate, in accordance with yet some other embodiments.
Figure 11:
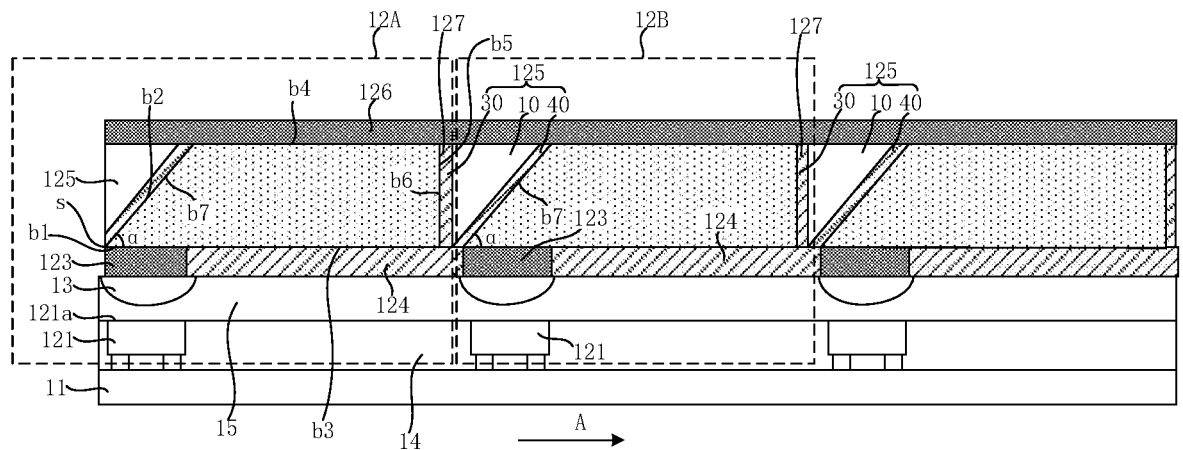
FIG. 11 is a sectional view of a light-emitting substrate, in accordance with yet some other embodiments.

In some embodiments, as shown in FIGS. 10 and 11, in a case where at least two light-emitting devices 12 each include the light-emitting element 121, the light conversion layer 122, the first material layer 123, the second material layer 124, the third material layer 125 and the fourth material layer 126, the at least two light-emitting devices 12 may include first light-emitting device(s) 12A and second light-emitting device(s) 12B that are sequentially arranged in the first direction A and adjacent. The third material layer 125 in a second light-emitting device 12B is in contact with the fifth surface b5 of the light conversion layer 122 in a first light-emitting device 12A adjacent to the second light-emitting device 12B.

In these embodiments, a portion of the third material layer 125 of the second light-emitting device 12B may further serve as a fifth material layer 127 of the first light-emitting device 12A. In this case, the third material layer 125 may include a sixth surface b6 and a seventh surface b7 that are opposite to each other in the first direction A. The sixth surface b6 may be perpendicular to the plane where the first surface b1 is located, and an included angle between the seventh surface b7 and the first surface b1 is α.

In some embodiments, a section of the third material layer 125 of the light-emitting device 12 may be in a shape of a right triangle in the sectional direction perpendicular to the straight line s.

In some embodiments, as shown in FIGS. 7 and 10, in a case where each of the at least one light-emitting device 12 further includes the fifth material layer 127, a material of the fifth material layer 127 is the same as the material of the third material layer 125. Or, as shown in FIG. 11, the third material layer 125 of the light-emitting device 12 includes a support layer 10, a first reflective layer 30 disposed on a surface of the support layer 10 facing away from the light conversion layer 122 of the light-emitting device 12 and facing a light conversion layer 122 of an adjacent light-emitting device 12, and a second reflective layer 40 disposed on a surface of the support layer 10 facing the light conversion layer 122 of the light-emitting device 12. For example, as shown in FIG. 11, the first reflective layer 30 of the second light-emitting device 12B is located on the surface of the support layer 10 of the second light-emitting device 12B facing the light conversion layer 122 of the first light-emitting device 12A.

In these embodiments, in the case where the material of the fifth material layer 127 is the same as the material of the third material layer 125, the material of the fifth material layer 127 and the material of the third material layer 125 may both be the material with the low refractive index or the reflective material. In this case, the fifth material layer 127 and the third material layer 125 may be formed through a same patterning process. In this way, formation processes may be decreased. In the case where the third material layer 125 of the light-emitting device 12 includes the support layer 10, the first reflective layer 30 and the second reflective layer 40, during the formation, the support layer 10 may be formed first, and then reflective layers are formed on the surface of the support layer 10 facing away from the light conversion layer 122 in the light-emitting device 12 and the surface of the support layer 10 facing the light conversion layer 122 in the light-emitting device 12 through the sputtering process. That is, the first reflective layer 30 is formed on the surface of the support layer 10 facing away from the light conversion layer 122 in the light-emitting device 12, and the second reflective layer 40 is formed on the surface of the support layer 10 facing the light conversion layer 122 in the light-emitting device 12. In this process, the process difficulty may be reduced. In addition, by forming the first reflective layer 30 on the surface of the support layer 10 facing away from the light conversion layer 122 in the light-emitting device 12, the first reflective layer 30 in the light-emitting device 12 may be in contact with the fifth surface b5 of the light conversion layer 122 in the adjacent light-emitting device 12 as the fifth material layer 127 in the adjacent light-emitting device 12. In this process, by reasonably setting a structure of the support layer 10, it may be possible to increase the length L' of the top side of the right trapezoid as much as possible in the case where there is no need to maintain the specific length-to-width ratio of the cavity, thereby achieving the purposes of increasing the propagation path of the light in the light conversion layer 122 and improving the light conversion efficiency.

Figure 12:
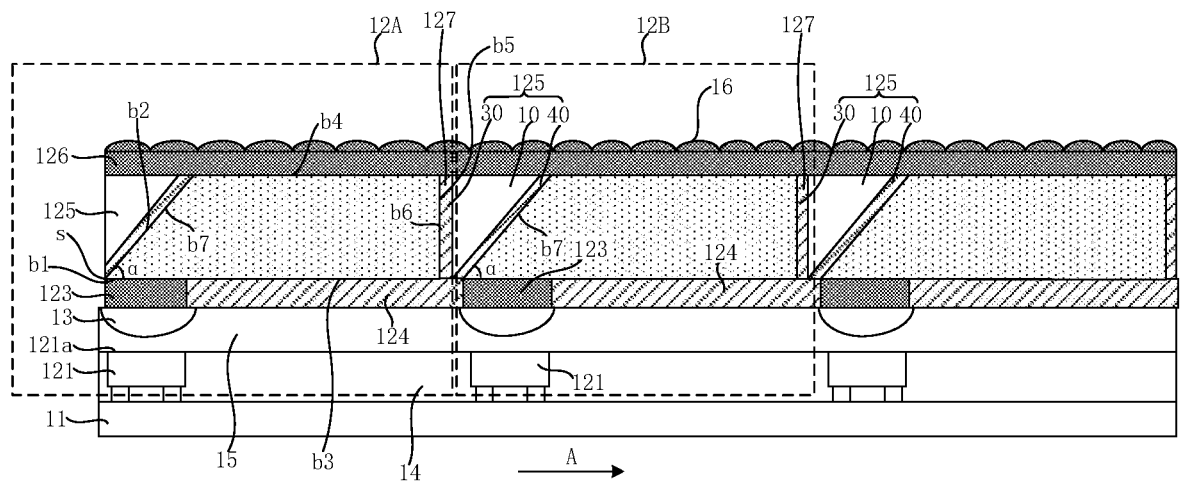
FIG. 12 is a sectional view of a light-emitting substrate, in accordance with yet some other embodiments.

In some embodiments, as shown in FIG. 12, the light-emitting substrate 1 further includes a lens structure 16 disposed on a light exit surface of the fourth material layer 126. The lens structure 16 is configured to diffuse light exiting from the fourth material layer 126, so that light mixing may be enhanced, and a viewing angle of an entire light-emitting substrate may be improved. A material of the lens structure 16 may be the same as the material of the fourth material layer 126. During formation, a material layer with a low refractive index may be formed first, and then the lens structure 16 may be formed through imprinting.

Some embodiments of the present disclosure provide a method for manufacturing a light-emitting substrate, which includes the following steps.

Referring to FIGS. 1 to 3, a plurality of light-emitting devices 12 are formed on a base 11. At least one light-emitting device 12 includes a light-emitting element 121 and a light conversion layer 122 formed on a light exit surface 121a of the light-emitting element 121. The light conversion layer 122 includes a first portion 122a and a second portion 122b located on a side, in a first direction A, of the first portion 122a, an orthogonal projection of the first portion 122a on the base 11 overlaps with an orthogonal projection of the light exit surface 121a on the base 11. The first direction A is perpendicular to a thickness direction of the base 11.

The at least one light-emitting device 12 further includes a first material layer 123 and a second material layer 124; the first material layer 123 is located between the light-emitting element 121 and the light conversion layer 122, and an orthogonal projection of the first material layer 123 on the base 11 overlaps with the orthogonal projection of the light exit surface 121a on the base 11; and the second material layer 124 is located on a side, in the first direction A, of the first material layer 123, and an orthogonal projection of the second material layer 124 on the base 11 overlaps with an orthogonal projection of the second portion 122b of the light conversion layer 122 on the base 11. The at least one light-emitting device 12 further includes a third material layer 125 and a fourth material layer 126; the third material layer 125 is located on a side face of the light conversion layer 122, and an orthogonal projection of the third material layer 125 on the base 11 overlaps with the orthogonal projection of the light exit surface 121a on the base 11; and the fourth material layer 126 is located on a side of the light conversion layer 122 away from the light-emitting element 121. The first material layer 123 is configured such that a portion of light emitted by the light-emitting element 121 corresponding to the first material layer 123 is incident into the light conversion layer 122 through the first material layer 123, so that the light conversion layer 122 converts a wavelength of the light emitted by the light-emitting element 121. The second material layer 123, the third material layer 125 and the fourth material layer 126 are configured such that light unconverted by the light conversion layer 122 is reflected on surfaces of a structure formed by the second material layer 124, the third material layer 125 and the fourth material layer 126, and light converted by the light conversion layer 122 exits through the fourth material layer 126.

According to that the light-emitting element 121 may be an electroluminescent element, such as an OLED light-emitting element or a light-emitting diode, the base 11 may be a base on which pixel driving circuits have been formed.

Figure 13:
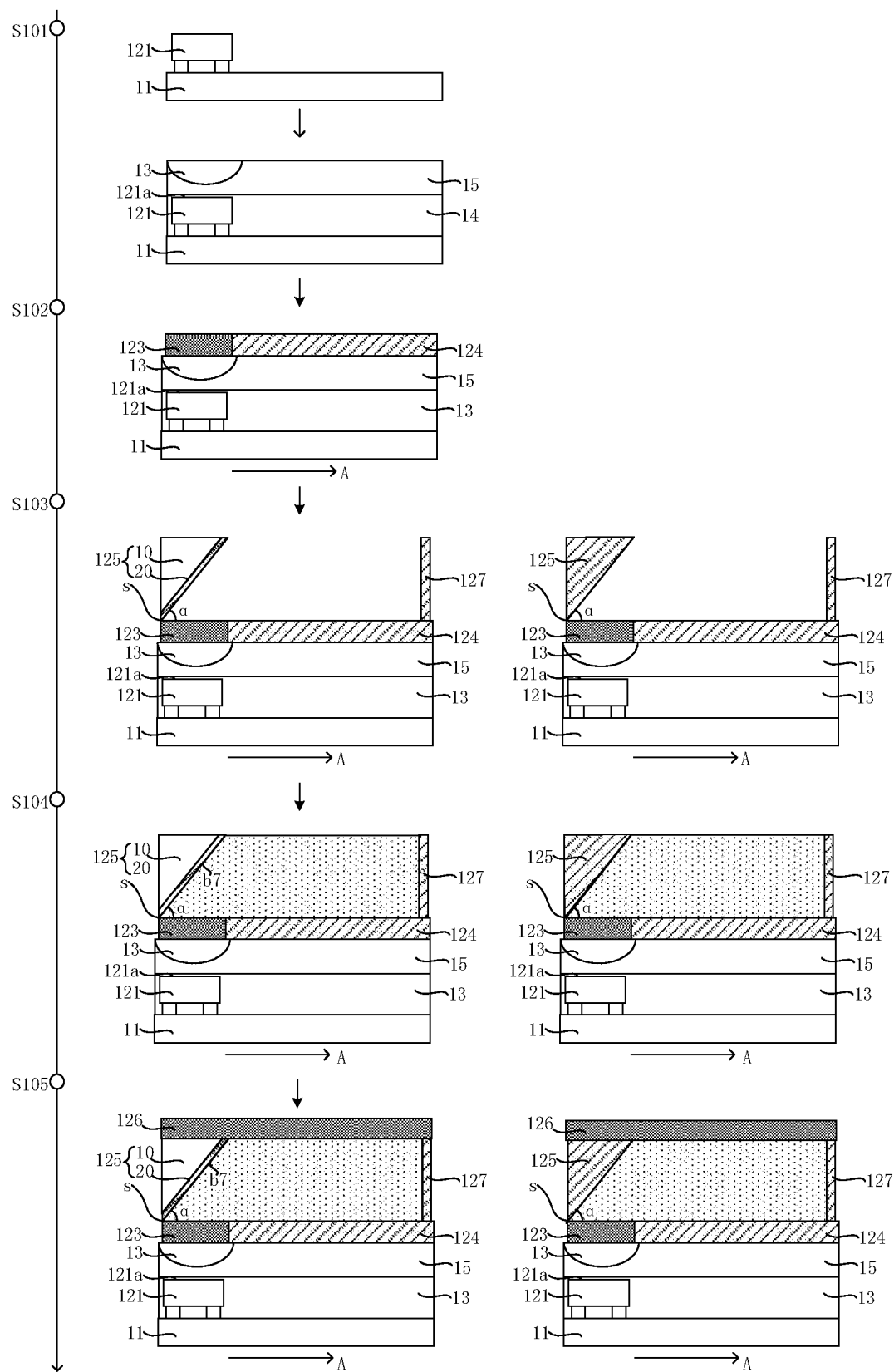
FIG. 13 is a flow chart of a method for manufacturing a light-emitting substrate, in accordance with some embodiments.

Forming the at least one light-emitting device including the light-emitting element 121, the light conversion layer 122, the first material layer 123, the second material layer 124, the third material layer 125 and the fourth material layer 126 on the base 11, as shown in FIG. 13, may include following steps.

In S101, at least one light-emitting element 121 is formed on the base 11, and the light exit surface 121a of each light-emitting element 121 is away from the base 11.

In an example where the light-emitting element 121 is the light-emitting diode, the at least one light-emitting element 121 may be formed on the base 11 through transfer printing.

In order to reduce a step difference between the light-emitting element 121 and the base 11, a planarization layer 14 may be formed on the base 11 on which the light-emitting element 121 has been formed.

In order to make the light emitted by the light-emitting element 121 vertically enter the first material layer 123, a light extraction structure 13 may be formed on the light exit surface 121a, which may be a lens. In this case, the lens may be fixed through a transparent material layer 15.

In S102, first material layer 123(s) and second material layer(s) 124 are formed on the base 11 on which the at least one light-emitting element 121 has been formed, the first material layer 123 is located on the region where the light exit surface 121a of each light-emitting element 121 is located, and the second material layer 124 is located on the side of the region where the light exit surface 121a of the light-emitting element 121 is located in the first direction A.

According to that the first material layer 123 is configured to cause the light emitted by the light-emitting element 121 to be incident into the light conversion layer 122, it may be known that, the first material layer 123 may be made of a transparent material. According to that the second material layer 124, the third material layer 125 and the fourth material layer 126 are configured such that the light unconverted by the light conversion layer 122 is reflected on the surfaces of the structure formed by the second material layer 124, the third material layer 125 and the fourth material layer 126, in some embodiments, the second material layer 124 may be made of a transparent material with a low refractive index or a reflective material, or the second material layer 124 may be of a composite structure with reflective surface(s).

Therefore, the materials of the first material layer 123 and the second material layer 124 may be the same or different.

In a case where the material of the first material layer 123 is the same as the material of the second material layer 124, the first material layer 123 and the second material layer 124 may be formed through a same patterning process. In this way, formation processes may be decreased.

Ina case where the materials of the first material layer 123 and the second material layer 124 are different, the first material layer 123 may be formed first; and after that, a metal film and a photoresist layer are sequentially formed on the base 11 on which the first material layer 123 has been formed, and then the second material layer 124 is formed through exposure, development and etching processes.

Structures of surfaces of the first material layer 123 and the second material layer 124 away from the base 11 are not specifically limited herein. The surfaces of the first material layer 123 and the second material layer 124 away from the base 11 may be flat, inclined, or provided with depressions or protrusions.

Here, it will be noted that, the embodiments of the present disclosure are only described by taking an example in which the surfaces of the first material layer 123 and the second material layer 124 away from the base 11 are flat.

In S103, the third material layer 125 of each light-emitting device 12 is formed on the base 11 on which the first material layer 123 and the second material layer 124 have been formed. The third material layer 125 includes a seventh surface b7 facing the first material layer 123, and an included angle between the seventh surface b7 and a surface of the first material layer 123 away from the base 11 is α.

According to that the second material layer 124, the third material layer 125 and the fourth material layer 126 are configured such that the light unconverted by the light conversion layer 122 is reflected on the surfaces of the structured formed by the second material layer 124, the third material layer 125 and the fourth material layer 126, and the included angle between the seventh surface b7 and the surface of the first material layer 123 away from the base 11 is α, in some embodiments, the seventh surface b7 of the third material layer 125 may be a reflective surface. Therefore, the third material layer 125 may be in any shape with an inclined surface, and may be formed through a patterning process.

Here, according to that a ratio of a refractive index of the third material layer 125 to a refractive index of the light conversion layer 122 is less than sin α, and/or at least a surface of the third material layer 125 in contact with a second surface b2 of a light conversion layer 122 to be formed is a reflective surface, it may be known that, a material of the third material layer 125 may be a material with a low refractive index or a reflective material, or the second material layer 124 may be of a composite structure with reflective surface(s).

In a case where the third material layer 125 is made of a metal material (i.e., the reflective material), a metal film may be formed first through sputtering or deposition, then a photoresist layer is formed on the metal film, and then the third material layer 125 is formed through exposure, development, and etching processes. In this process, the inclined surface of the third material layer 125 may be formed by controlling an inclination angle of each slope constituting the inclined surface in each step. In a case where the third material layer 125 is made of a material with a low refractive index, an inclination angle of the inclined surface may be controlled only by controlling a scattering angle of the light during the exposure. In a case where the third material layer 125 including a support layer 10 and a metal reflective layer 20 formed on a surface of the support layer 10 facing the light conversion layer 122 is formed, the support layer 10 is formed by controlling the scattering angle of the light during the exposure, the reflective surface at the included angle of α with the surface of the first material layer 123 away from the base 11 may be formed by forming the metal reflective layer 20 on the surface of the support layer 10 facing the light conversion layer 122 through sputtering.

In some embodiments, each of the at least one light-emitting device 12 further includes a fifth material layer 127, and a material of the fifth material layer 127 and the material of the third material layer 125 may be the same or different.

In a case where the material of the fifth material layer 127 is the same as the material of the third material layer 125, at a same time when the third material layer 125 is formed, the manufacturing method further includes forming the fifth material layer 127. In this way, formation processes may be decreased.

In S104, the light conversion layer 122 of each light-emitting device 12 is formed on the base 11 on which the third material layer 125 has been formed, and the light conversion layer 122 is in contact with the first material layer 123, the second material layer 124 and the third material layer 125.

The first material layer 123 is configured to cause the light emitted by the light-emitting element 121 to be incident into the light conversion layer 122, so that the light conversion layer 122 converts the wavelength of the light emitted by the light-emitting element 121; the second material layer 123, the third material layer 125 and the fourth material layer 126 are configured such that the light unconverted by the light conversion layer 122 is reflected on the surfaces of the structure formed by the second material layer 125, the third material layer 126 and the fourth material layer 126, and the light converted by the light conversion layer 122 exits through the fourth material layer 126; and the included angle between the seventh surface b7 of the third material layer 125 facing the first material layer 123 and the surface of the first material layer 123 away from the base 11 is α. Therefore, a section of the light conversion layer 122 is in a shape of a right trapezoid in a sectional direction perpendicular to a straight line s.

In S105, a fourth material layer 126 of each light-emitting device 12 is formed on the base 11 on which the light conversion layer 122 has been formed. The fourth material layer 126 may be formed on a side of the light conversion layer 122 away from the light-emitting element 121 and in contact with the light conversion layer 122.

Figure 14:
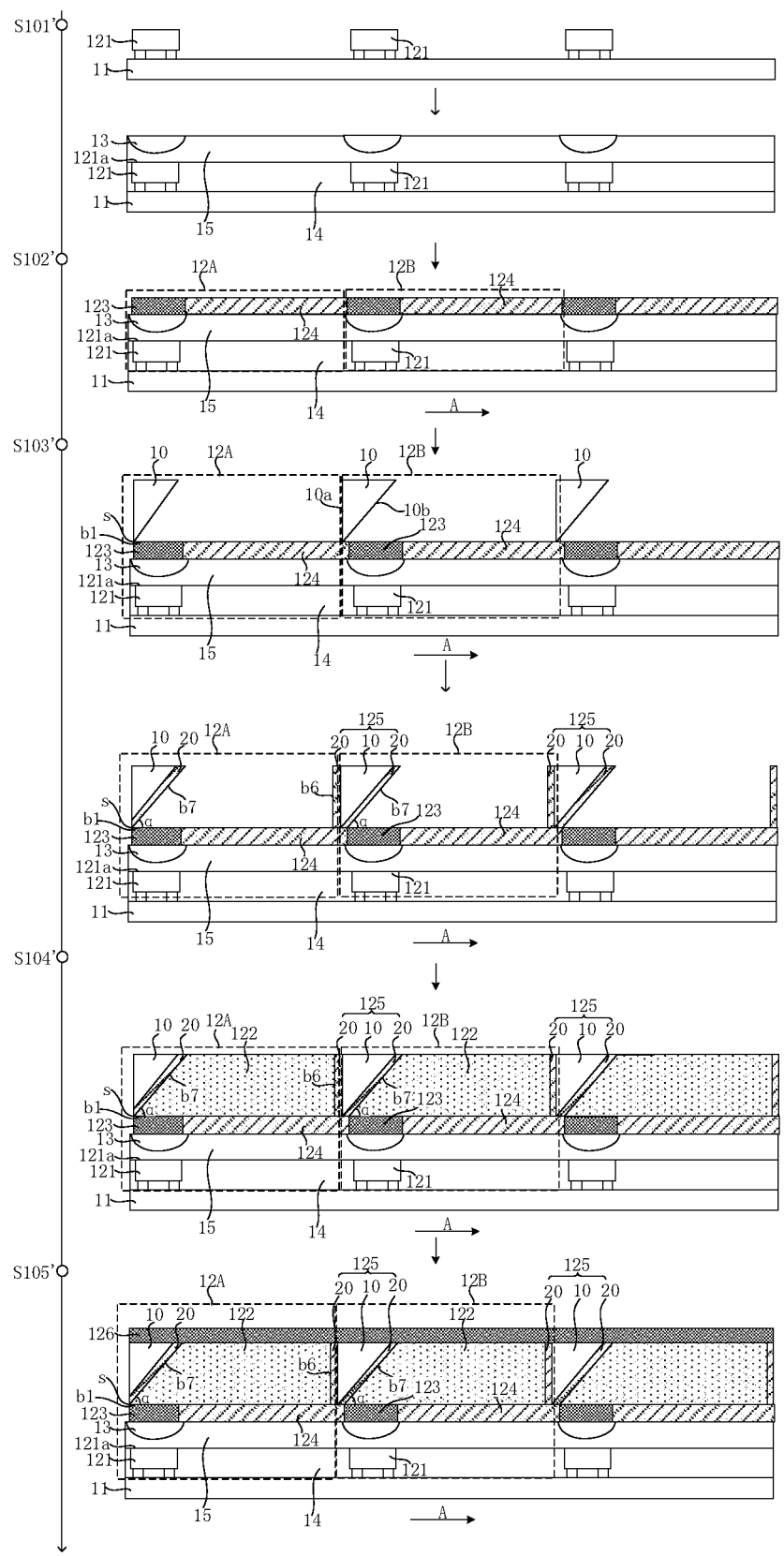
FIG. 14 is a flow chart of a method for manufacturing a light-emitting substrate, in accordance with some other embodiments.

In some embodiments, as shown in FIGS. 10 and 11, in a case where the at least one light-emitting device 12 includes first light-emitting device(s) 12A and second light-emitting device(s) 12B that are sequentially arranged in the first direction A and adjacent, forming the first light-emitting device 12A and the second light-emitting device 12B on the base 11, as shown in FIG. 14, includes following steps.

In S101', light-emitting elements 121 spaced apart are formed on the base 11, and a light exit surface 121a of each light-emitting element 121 is away from the base 11.

Here, it is still taken as an example that the light-emitting element 121 is the light-emitting diode, and the light-emitting elements 121 may be formed on the base 11 through the transfer printing.

In order to reduce the step difference between the light-emitting elements 121 and the base 11, the planarization layer 14 may be formed on the base 11 on which the light-emitting elements 121 have been formed.

In order to make the light emitted by the light-emitting element 121 vertically enter the first material layer 123, the light extraction structure 13 may be formed on the light exit surface 121a. The light extraction structure 13 may be a lens. In this case, the lens may be fixed through the transparent material layer 15.

In S102', the first material layers 123 and the second material layers 124 are formed on the base 11 on which the light-emitting elements 121 have been formed, the first material layer is located on the region where the light exit surface 121a of each light-emitting element 121 is located, and the second material layer 124 is located on the side of the region where the light exit surface 121a of each light-emitting element 121 is located in the first direction A.

According to that the first material layer 123 is configured to cause the light emitted by the light-emitting element 121 to be incident the light conversion layer 122, it may be known that, the first material layer 123 may be made of a transparent material. According to that the second material layer 124, the third material layer 125 and the fourth material layer 126 are configured such that the light unconverted by the light conversion layer 122 is reflected on the surfaces of the structure formed by the second material layer 124, the third material layer 125 and the fourth material layer 126, it may be known that, the second material layer 124 may be made of a transparent material with a low refractive index, a light reflective material, or the second material layer 124 may be made of a composite structure with reflective surface(s).

Therefore, the materials of the first material layer 123 and the second material layer 124 may be the same or different.

In the case where the material of the first material layer 123 is the same as the material of the second material layer 124, the first material layer 123 and the second material layer 124 may be formed through the same patterning process. In this way, the formation processes may be decreased.

For a specific manufacturing method for forming the first material layer 123 and the second material layer 124, reference may be made to the above description of the method for forming the first material layer 123 and the second material layer 124 in the case where the at least one light-emitting device 12 includes the light-emitting element 121, the light conversion layer 122, the first material layer 123, the second material layer 124, the third material layer 125 and the fourth material layer 126.

The structures of the surfaces of the first material layer 123 and the second material layer 124 away from the base 11 are not specifically limited herein. The surfaces of the first material layer 123 and the second material layer 124 away from the base 11 may be flat, or inclined, or provided with depressions or protrusions.

Here, it will be noted that, the embodiments of the present disclosure are only described by taking the example in which the surfaces of the first material layer 123 and the second material layer 124 away from the base 11 are flat.

In S103', respective third material layers 125 of the first light-emitting device(s) 12A and the second light-emitting device(s) 12B are formed on the base 11 on which first material layers 123 and second material layers 124 have been formed. A third material layer 125 of each light-emitting device 12 includes a sixth surface b6 and a seventh surface b7. An included angle between the seventh surface b7 and the surface of the first material layer 123 away from the base 11 is $\alpha$, and an included angle between the sixth surface b6 and a plane where the surface of the first material layer 123 away from the base 11 is located is 90°.

According to that the second material layer 124, the third material layer 125 and the fourth material layer 126 are configured such that the light unconverted by the light conversion layer 122 is reflected on the surfaces of the structure formed by the second material layer 124, the third material layer 125 and the fourth material layer 126, and the included angle between the seventh surface b7 and the surface of the first material layer 123 away from the base 11 is $\alpha$, in some embodiments, the seventh surface b7 of the third material layer 125 may be a reflective surface.

According to that the included angle between the sixth surface b6 and the plane where the surface of the first material layer 123 away from the base 11 is located is 90°, it may be known that, the third material layer 125 may be any material layer with the sixth surface b6 and the seventh surface b7, and may also be formed through the patterning process.

Here, according to that the ratio of the refractive index of the third material layer 125 to the refractive index of the light conversion layer 122 is less than sin $\alpha$, and/or at least the surface of the third material layer 125 in contact with the light conversion layer 122 to be formed is a reflective surface, it may be known that, the material of the third material layer 125 may also be a material with a low refractive index or a light reflective material, or the third material layer 125 may be of a composite structure with reflective surface(s).

In S104', respective light conversion layers 122 of the first light-emitting device(s) 12A and the second light-emitting device(s) 12B are formed on the base 11 on which the third material layers 125 have been formed. A light conversion layer 122 of the first light-emitting device 12A is formed in a depression formed by the first material layer 123, the second material layer 124, the third material layer 125 of the first light-emitting device 12A and the third material layer 125 of the second light-emitting device 12B.

According to that the first material layer 123 is configured to cause the light emitted by the light-emitting element 12 to be incident into the light conversion layer 122, so that the light conversion layer 122 converts the wavelength of the light emitted by the light-emitting element 12; the second material layer 124, the third material layer 125 and the fourth material layer 126 are configured such that the light unconverted by the light conversion layer 122 is reflected on the surfaces of the structure formed the second material layer 124, the third material layer 125 and the fourth material layer 126, and the light converted by the light conversion layer 122 exits through the fourth material layer 126; and the included angle between the seventh surface b7 of the third material layer 125 and the surface of the first material layer 123 away from the base 11 is $\alpha$, it may be known that, the section of the light conversion layer 122 is in the shape of the right trapezoid in the sectional direction perpendicular to the straight line s.

Based on this, according to that the light conversion layer 122 of the light-emitting device 12 is formed in the depression formed by the first material layer 123, the second material layer 124, the third material layer 125 of the light-emitting device 12 and the third material layer 125 of the adjacent light-emitting device 12, in some embodiments, a portion of the third material layer 125 of the adjacent light-emitting device further serves as the fifth material layer 127 of the light-emitting device 12.

In this case, forming the third material layer 125 of the light-emitting device 12, as shown in FIG. 14, may include following steps.

A support layer 10 with a first sputtering surface 10a and a second sputtering surface 10b is formed through a patterning process. The first sputtering surface 10a is perpendicular to the plane where the surface of the first material layer 123 away from the base 11 is located, and an included angle between the second sputtering surface 10b and the surface of the first material layer 123 away from the base 11 is α.

The support layer 10 may be made of a resin material such as photosensitive resin, and the support layer 10 may be formed directly by coating the photosensitive resin and through exposure and development processes.

A metal reflective layer 20 is formed on the second sputtering surface 10b through a sputtering process. At a same time when the metal reflective layer 20 is formed on the second sputtering surface 10b, another metal reflective layer 20 is formed on the first sputtering surface 10a through a sputtering process, so as to form the fifth material layer 127 of the adjacent light-emitting device 12 for contacting the light conversion layer 122 of the adjacent light-emitting device 12.

In this case, the fifth material layer 127 of the adjacent light-emitting device 12 may be the metal reflective layer 20 formed on the first sputtering surface 10a of the support layer 10 of the light-emitting device 12. Referring to FIG. 8, a length L' of a bottom side of the right trapezoid may be increased as much as possible, so that purposes of increasing a propagation path of the light in the light conversion layer 122 and improving a light conversion efficiency may be achieved.

In S105', respective fourth material layers 126 of the first light-emitting device(s) 12A and the second light-emitting device(s) 12B are formed on the base 11 on which the light conversion layers 122 have been formed. The fourth material layers 126 may be formed on sides of the respective light conversion layers 122 of the first light-emitting device(s) 12A and the second light emitting device(s) 12B away from the light-emitting elements 121 and in contact with corresponding light conversion layers 122.

In order to objectively describe the technical effects of the technical solutions provided by the embodiments of the present disclosure, various possible implementations will be exemplarily described through the following embodiments.

In the first case where the included angle α between the surface of the third material layer 125 in contact with the light conversion layer 122 and the surface of the first material layer 123 away from the base 11 is equal to 60°, in order to make the light vertically incident on the surface of the third material layer 125 in contact with the light conversion layer 122 and be reflected by the surface of the third material layer 125 in contact with the light conversion layer 122, and propagate in the light conversion layer 122 in the reverse direction, at least the surface of the third material layer 125 in contact with the light conversion layer 122 is a reflective surface. According to that the light is reflected on the surfaces of the structure formed by the second material layer 124, the third material layer 125, the fourth material layer 126 and even the fifth material layer 127, and propagates in the light conversion layer 122, it may be known that, in order to avoid the light leakage caused by the incidence of the light emitted by the light-emitting element 121 through the second material layer 124, the material of the second material layer 124 may include an opaque metal material.

In the second case where the included angle α between the surface of the third material layer 125 in contact with the light conversion layer 122 and the surface of the first material layer 123 away from the base 11 is not equal to 60°, the materials of the third material layer 125, the second material layer 124 and the fifth material layer 127 may each be a material with a low refractive index.

In the first case, only a situation where the materials of the second material layer 124, the third material layer 125 and the fifth material layer 127 may each include the opaque metal material is shown. In a case where the second material layer 124, the third material layer 125 and the fifth material layer 127 may each be made of a reflective material or may be of a composite structure with reflective surface(s), the formation of the second material layer 124, the third material layer 125 and the fifth material layer 127 is shown in Embodiment 1 and Embodiment 2.

In the second case, only a situation where the materials of the second material layer 124 and the fifth material layer 127 are each a material with a low refractive index is shown. In this case, the formation of the second material layer 124 and the fifth material layer 127 is shown in Embodiment 3 and Embodiment 4.

In the Embodiment 1, a material layer with a low refractive index is first formed through spin coating on the base on which the light-emitting elements 121 have been formed, and then the first material layer 123 is formed by performing the patterning process on the material layer with the low refractive index. Afterwards, metal films are formed through the sputtering processes, and the second material layer 124, the third material layer 125 and the fifth material layer 127 are formed by performing the patterning processes on the metal films. In addition, when the third material layer 125 is formed through the patterning process, the angle of the inclined surface of the third material layer 125 is controlled.

In the Embodiment 2, for the method for forming the first material layer 123, reference may be referred to that shown in the Embodiment 1. Then, respective support layers of the second material layer 124, the third material layer 125 and the fifth material layer 127 are formed through spin coating processes. A material of the support layer may be a resin material, and a refractive index of the support layer 10 is not specifically limited here. Afterwards, metal reflective layers are formed on surfaces of the respective support layers of the second material layer 124, the third material layer 125 and the fifth material layer 127 through the sputtering processes.

In the Embodiment 3, unlike the Embodiment 2, the material of the support layer of the second material layer 124 may be the material with the low refractive index, a metal reflective layer is not formed on a corresponding surface of the support layer of the second material layer 124, and a ratio of the refractive index of the material with the low refractive index to the refractive index of the light conversion layer 122 is less than sin α.

In the Embodiment 4, unlike the Embodiment 2, the materials of the respective support layers of the second material layer 124 and the fifth material layer 127 may each be the material with the low refractive index, and metal reflective layers are not formed on surfaces of the respective support layers of the second material layer 124 and the fifth material layer 127, and a ratio of the refractive index of the material with the low refractive index to the refractive index of the light conversion layer 122 is less than sin α.

In summary, by arranging the first material layer 123, the second material layer 124, the third material layer 125, the fourth material layer 126 and the light conversion layer 122 on the light exit side of the light-emitting element 121, and reasonably setting the structures and materials of the first material layer 123, the second material layer 124, the third material layer 125 and the fourth material layer 126, the light emitted by the light-emitting element 121 may propagate in the light conversion layer 122 in the form of total reflection, and the light emitted by the light-emitting element 121 may be sufficiently received by the light conversion layer 122. As a result, the wavelength of the light emitted by the light-emitting element 121 may be sufficiently converted by the light conversion layer 122, and the light conversion efficiency may be improved. Compared with a case where there is a need to add scattering particles in the light conversion layer 122 to improve the light conversion efficiency, in the embodiments of the present disclosure, the light conversion efficiency may be improved, and it may be possible to avoid a problem that process difficulty is increased due to use of the scattering particles, and improve leakage of the light unconverted by the light conversion layer 122.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:
   a light-emitting element including a light exit surface;
   a light conversion layer disposed on a light exit side of the light-emitting element, wherein the light conversion layer includes a first portion and a second portion located on a side of the first portion in a first direction, the first direction being perpendicular to a thickness direction of the light-emitting element; and an orthogonal projection of the first portion on a plane perpendicular to the thickness direction of the light-emitting element overlaps with an orthogonal projection of the light exit surface on the plane;
   a first material layer disposed between the light-emitting element and the light conversion layer, wherein an orthogonal projection of the first material layer on the plane overlaps with the orthogonal projection of the light exit surface on the plane;
   a second material layer located on a side of the first material layer in the first direction, wherein an orthogonal projection of the second material layer on the plane overlaps with an orthogonal projection of the second portion on the plane;
   a third material layer located on a side face of the light conversion layer, wherein an orthogonal projection of the third material layer on the plane overlaps with the orthogonal projection of the light exit surface on the plane;
   a fourth material layer located on a side of the light conversion layer away from the light-emitting element, wherein
   the first material layer is configured such that a portion of light emitted by the light-emitting element corresponding to a region where the first material layer is located is incident into the light conversion layer through the first material layer, so that the light conversion layer converts a wavelength of the light emitted by the light-emitting element; and
   the second material layer, the third material layer and the fourth material layer are configured such that light unconverted by the light conversion layer is reflected on surfaces of a structure formed by the second material layer, the third material layer and the fourth material layer, and light converted by the light conversion layer exits through the fourth material layer.

2. The light-emitting device according to claim 1, wherein
   the first portion of the light conversion layer includes a first surface and a second surface that are sequentially arranged in a light exit direction of the light-emitting element; the second portion of the light conversion layer includes a third surface and a fourth surface that are sequentially arranged in the light exit direction of the light-emitting element;
   the first surface is in contact with the first material layer, and the second surface is in contact with the third material layer; the third surface is in contact with the second material layer, and the fourth surface is in contact with the fourth material layer;
   a surface of the third material layer in contact with the second surface is an inclined surface, and an included angle between the inclined surface and the first surface is α;
   the inclined surface intersects with a plane where the first surface is located at a straight line, and a section of the light conversion layer is in a shape of a right trapezoid in a sectional direction perpendicular to the straight line; and
   a ratio of each of a refractive index of the first material layer and a refractive index of the fourth material layer to a refractive index of the light conversion layer is less than sin α; a ratio of a refractive index of the second material layer to the refractive index of the light conversion layer is less than sin α, and/or, at least a surface of the second material layer in contact with the third surface is a reflective surface; a ratio of a refractive index of the third material layer to the refractive index of the light conversion layer is less than sin α, and/or, at least a surface of the third material layer in contact with the second surface is a reflective surface.

3. The light-emitting device according to claim 2, wherein
   the light conversion layer further includes a fifth surface opposite to the second surface; and
   the light-emitting device further comprises a fifth material layer disposed on the fifth surface; and a ratio of a refractive index of the fifth material layer to the refractive index of the light conversion layer is less than sin α, and/or, at least a surface of the fifth material layer in contact with the fifth surface is a reflective surface.

4. The light-emitting device according to claim 2, wherein α is less than or equal to 60°.

5. The light-emitting device according to claim 2, wherein α is equal to 60°, the surface of the third material layer in contact with the second surface is the reflective surface, a length of a top side of the right trapezoid is 3n times a length of the light exit surface of the light-emitting element in the first direction, and a height of the right trapezoid is $\sqrt{3}$ times the length of the light exit surface of the light-emitting element in the first direction, n being an integer greater than or equal to 1.

6. The light-emitting device according to claim 2, wherein α is not equal to 60°, the surface of the third material layer in contact with the second surface is the reflective surface, and the light-emitting device further comprises a filter film disposed on a side of the fourth material layer away from the light conversion layer and configured to filter the light emitted by the light-emitting element.

7. The light-emitting device according to claim 2, wherein at least the surface of the third material layer in contact with the second surface is the reflective surface, and the third material layer includes a support layer and a metal reflective layer disposed on a surface of the support layer facing the light conversion layer, wherein a surface of the metal reflective layer facing the light conversion layer is a reflective surface.

8. The light-emitting device according to claim 1, wherein a material of the light conversion layer includes a quantum dot luminescent material, and the material of the light conversion layer does not include scattering particles.

9. The light-emitting device according to claim 1, wherein the light-emitting element is a light-emitting diode; and the light-emitting device further comprises a light extraction structure disposed between the light-emitting element and the first material layer, and configured to cause the light emitted by the light-emitting element to be incident into the first material layer vertically.

10. The light-emitting device according to claim 1, further comprising a lens structure disposed on a light exit surface of the fourth material layer, wherein
the lens structure is configured to diffuse light exiting from the fourth material layer.

11. A light-emitting substrate, comprising:
a base; and
a plurality of light-emitting devices disposed on the base; wherein
at least one light-emitting device is the light-emitting device according to claim 1.

12. The light-emitting substrate according to claim 11, wherein the at least one light-emitting device includes at least two light-emitting devices, and the light conversion layer of each light-emitting device in the at least two light-emitting devices includes a fifth surface opposite to a second surface that is in contact with the third material layer; the at least two light-emitting devices include at least one first light-emitting device and at least one second light-emitting device that are sequentially arranged in the first direction and adjacent; and the third material layer of a second light-emitting device is in contact with the fifth surface of the light conversion layer of a first light-emitting device.

13. The light-emitting substrate according to claim 12, wherein
each of the at least one light-emitting device further includes a fifth material layer disposed on the fifth surface opposite to the second surface;
a material of the fifth material layer is the same as a material of the third material layer; or the third material layer of the light-emitting device includes a support layer, a first reflective layer disposed on a surface of the support layer away from the light conversion layer of the first light-emitting device, and a second reflective layer disposed on a surface of the support layer facing the light conversion layer of the light-emitting device, the first reflective layer serving as the fifth material layer of an adjacent light-emitting device.

14. A light-emitting apparatus, comprising the light-emitting substrate according to claim 11.

15. A method for manufacturing a light-emitting substrate, comprising:
forming a plurality of light-emitting devices on a base, wherein forming each of at least one light-emitting device includes:
forming a light-emitting element on the base, the light-emitting element including a light exit surface;
forming a first material layer and a second material layer on the base on which the light-emitting element has been formed, wherein an orthogonal projection of the first material layer on the base overlaps with an orthogonal projection of the light exit surface on the base; the second material layer is located on a side of the first material layer in a first direction, the first direction being parallel to a plane perpendicular to a thickness direction of the light-emitting element;
forming a third material layer on the base on which the first material layer and the second material layer have been formed, wherein an orthogonal projection of the third material layer on the base overlaps with the orthogonal projection of the light exit surface on the base;
forming a light conversion layer on the base on which the first material layer, the second material layer and the third material layer have been formed, wherein the light conversion layer includes a first portion and a second portion; an orthogonal projection of the first portion on the base overlaps with the orthogonal projection of the light exit surface on the plane, and an orthogonal projection of the second portion on the base overlaps with an orthogonal projection of the second material layer on the base; and
forming a fourth material layer on a side of the light conversion layer away from the base, wherein
the first material layer is configured such that a portion of light emitted by the light-emitting element corresponding to the first material layer is incident into the light conversion layer through the first material layer, so that the light conversion layer converts a wavelength of the light emitted by the light-emitting element; and
the second material layer, the third material layer and the fourth material layer are configured such that light unconverted by the light conversion layer is reflected on surfaces of a structure formed by the second material layer, the third material layer and the fourth material layer, and light converted by the light conversion layer exits through the fourth material layer.

16. The method according to claim 15, wherein the at least one light-emitting device includes at least one first light-emitting device and at least one second light-emitting device that are sequentially arranged in the first direction and adjacent; and
forming a first light-emitting device and a second light-emitting device on the base includes:
forming light-emitting elements on the base, the light-emitting elements being spaced apart in the first direction, and the light exit surface of each light-emitting element being away from the base;
forming first material layers on the base on which the light-emitting elements have been formed, a first material layer being located on the light exit surface of each light-emitting element;

forming second material layers on the base on which the light-emitting elements have been formed, a second material layer being located on the side of the first material layer in the first direction;

forming respective third material layers of the first light-emitting device and the second light-emitting device on the base on which the first material layers and the second material layers have been formed, wherein a third material layer of each light-emitting device includes a sixth surface and a seventh surface; an included angle between the seventh surface and a surface of the first material layer away from the base is $\alpha$, and an included angle between the sixth surface and a plane where the surface of the first material layer away from the base is located is 90°;

forming respective light conversion layers of the first light-emitting device and the second light-emitting device on the base on which the third material layers have been formed, wherein a light conversion layer of each light-emitting device is formed in a depression formed by the first material layer, the second material layer and the third material layer of the light-emitting device and the third material layer of an adjacent light-emitting device; and forming respective fourth material layers of the first light emitting device and the second light emitting device on the base on which the light conversion layers have been formed.

17. The method according to claim 15, wherein a ratio of a refractive index of the second material layer to a refractive index of the light conversion layer is less than sin $\alpha$, and the second material layer and the first material layer are formed through a same patterning process.

18. The method for manufacturing the light-emitting substrate according to claim 16, wherein at least a surface of the second material layer in contact with the light conversion layer is a reflective surface, and forming the second material layer includes:

forming a metal film on the base on which the light-emitting elements have been formed; and forming a metal reflective layer through a patterning process to form the second material layer.

19. The method according to claim 16, wherein the at least one light-emitting device further includes a fifth material layer, and forming the first light-emitting device and the second light-emitting device further includes: forming the fifth material layer of each light-emitting device at a same time when the third material layer of each light-emitting device is formed; or forming the third material layer of the light-emitting device includes:

forming a support layer with a first sputtering surface and a second sputtering surface through a patterning process, wherein the first sputtering surface is perpendicular to the plane where the surface of the first material layer away from the base is located, and an included angle between the second sputtering surface and the surface of the first material layer away from the base is $\alpha$; and forming a metal reflective layer on the second sputtering surface through a sputtering process, and forming another metal reflective layer on the first sputtering surface through a sputtering process at a same time, so as to form the fifth material layer of the adjacent light-emitting device for contacting the light conversion layer of the adjacent light-emitting device.

* * * * *